United States Patent
Han et al.

(10) Patent No.: US 11,978,654 B2
(45) Date of Patent: May 7, 2024

(54) SUBSTRATE PROCESSING APPARATUS

(71) Applicant: SEMES Co. Ltd., Cheonan-si (KR)

(72) Inventors: Min Sung Han, Hwaseong-si (KR);
Wan Jae Park, Hwaseong-si (KR);
Yoon Jong Ju, Cheonan-si (KR);
Jaehoo Lee, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 377 days.

(21) Appl. No.: 17/082,634

(22) Filed: Oct. 28, 2020

(65) Prior Publication Data

US 2021/0125854 A1 Apr. 29, 2021

(30) Foreign Application Priority Data

Oct. 28, 2019 (KR) .................. 10-2019-0134418

(51) Int. Cl.
*H01L 21/687* (2006.01)
*B25J 11/00* (2006.01)
(Continued)

(52) U.S. Cl.
CPC ..... *H01L 21/68707* (2013.01); *B25J 11/0095* (2013.01); *B25J 15/0014* (2013.01);
(Continued)

(58) Field of Classification Search
CPC ............... B25J 11/0095; B25J 15/0014; H01J 2237/204; H01J 2237/334; H01J 37/32724; H01J 37/32733; H01L 21/67069; H01L 21/67103; H01L 21/67115; H01L 21/67196; H01L 21/67201;
(Continued)

(56) References Cited

U.S. PATENT DOCUMENTS

2002/0005168 A1* 1/2002 Kraus ............... H01L 21/67184
118/715
2014/0017041 A1* 1/2014 Jung .................. G01R 31/2891
414/222.01
(Continued)

FOREIGN PATENT DOCUMENTS

| JP | 2006-186189 A | 7/2006 |
| JP | 2008-109136 A | 5/2008 |
| KR | 10-2009-0037931 A | 4/2009 |

OTHER PUBLICATIONS

Korean Office Action issued on Dec. 17, 2020, in counterpart Korean Patent Application No. 10-2019-0134418 (9 pages in Korean).

*Primary Examiner* — Sang Y Paik
(74) *Attorney, Agent, or Firm* — NSIP Law

(57) ABSTRACT

The present invention relates to a substrate processing apparatus capable of shortening a process time, and the substrate processing apparatus according to the present invention comprises an index chamber having a transfer robot loading/unloading a substrate; a process chamber having a heating means heating the substrate and processing the substrate; a loadlock chamber disposed between the index chamber and the process chamber; and a conveying chamber having a conveying robot conveying the substrate between the process chamber and the loadlock chamber, wherein a pre-heating means is provided in the conveying robot to pre-heat the substrate in a state before processing.

20 Claims, 4 Drawing Sheets

(51) Int. Cl.
*B25J 15/00* (2006.01)
*H01J 37/32* (2006.01)
*H01L 21/67* (2006.01)
*H01L 21/683* (2006.01)
*H05B 1/02* (2006.01)
*H05B 3/00* (2006.01)

(52) U.S. Cl.
CPC .. *H01J 37/32724* (2013.01); *H01J 37/32733* (2013.01); *H01L 21/67069* (2013.01); *H01L 21/67103* (2013.01); *H01L 21/67115* (2013.01); *H01L 21/67201* (2013.01); *H01L 21/6833* (2013.01); *H05B 1/0233* (2013.01); *H05B 3/0047* (2013.01); *H01J 2237/204* (2013.01); *H01J 2237/334* (2013.01)

(58) Field of Classification Search
CPC ........... H01L 21/67742; H01L 21/6833; H01L 21/68707; H05B 1/0233; H05B 3/0047
USPC ...................................... 219/444.1
See application file for complete search history.

(56) References Cited

U.S. PATENT DOCUMENTS

| | | | |
|---|---|---|---|
| 2015/0013606 A1* | 1/2015 | Terada | H01L 21/67155 |
| | | | 118/725 |
| 2015/0170945 A1* | 6/2015 | Segawa | H01L 21/67115 |
| | | | 414/217 |

* cited by examiner

【FIG 1】
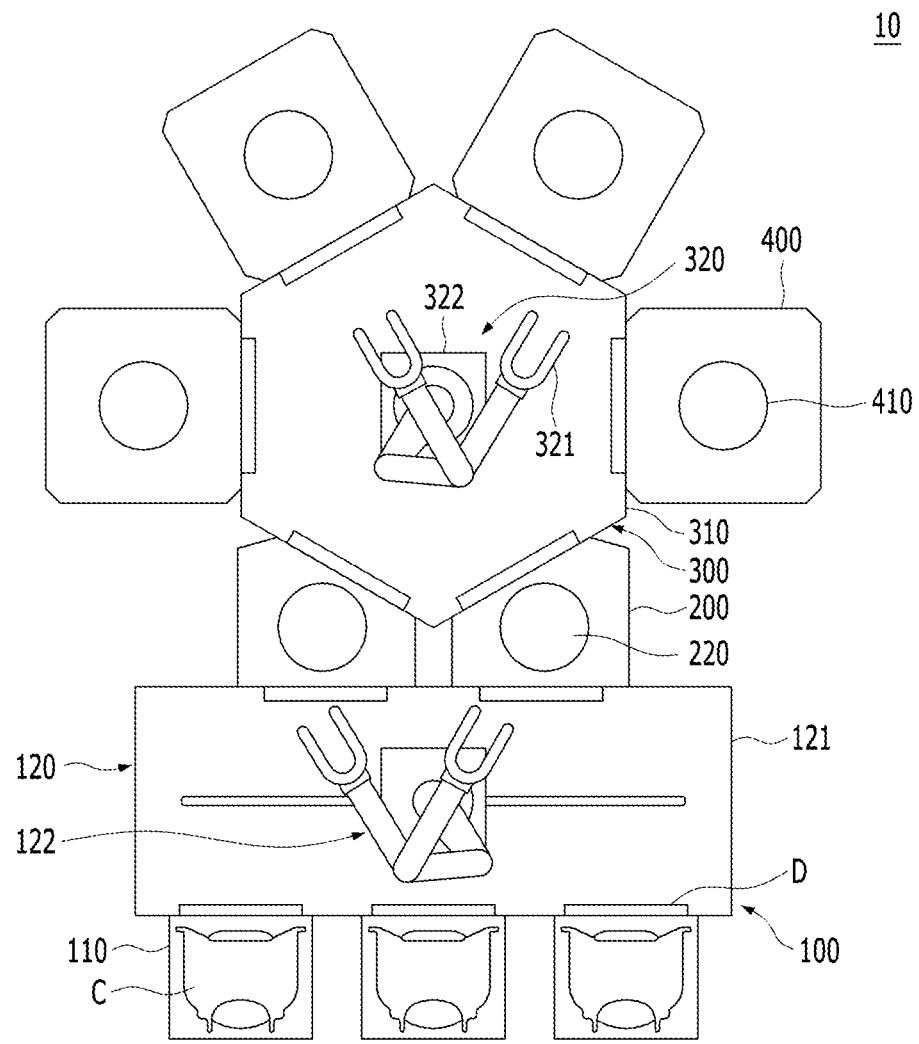

【 FIG 2A】
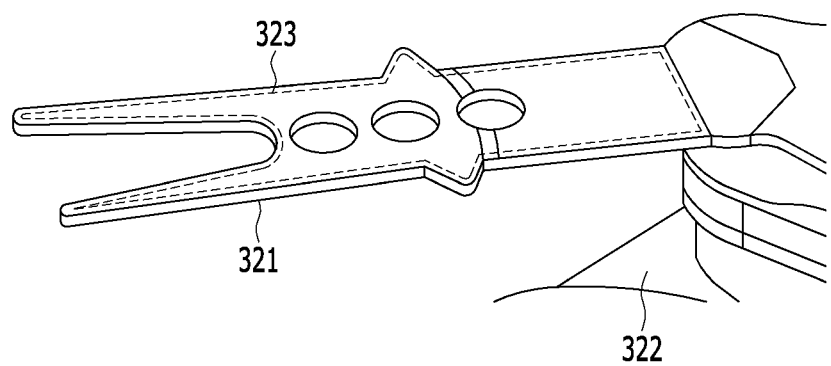
【 FIG 2B 】
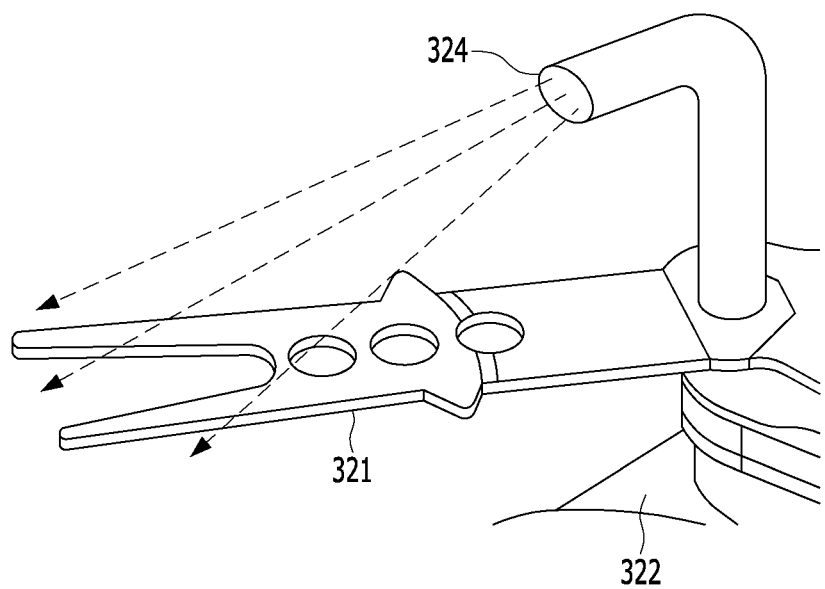

【FIG 2C】
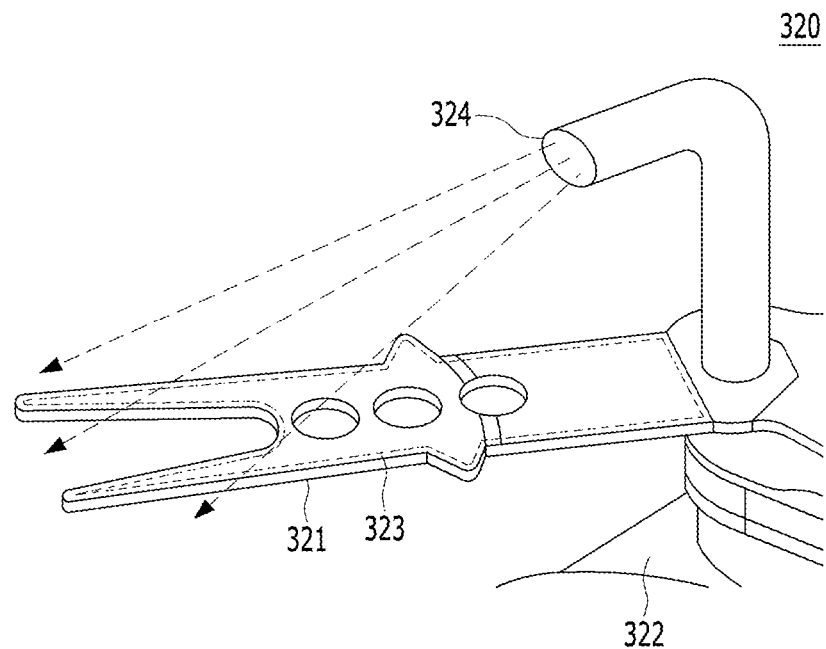
【FIG 3A】
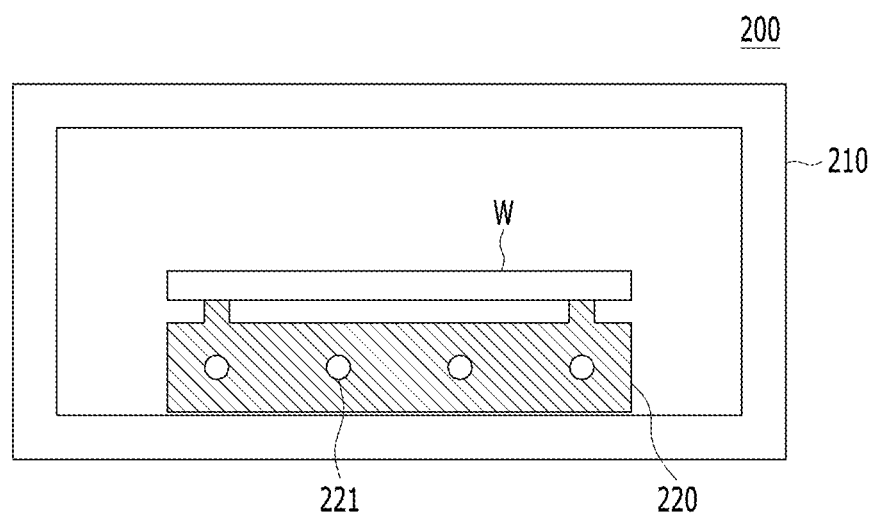

【FIG 3B】
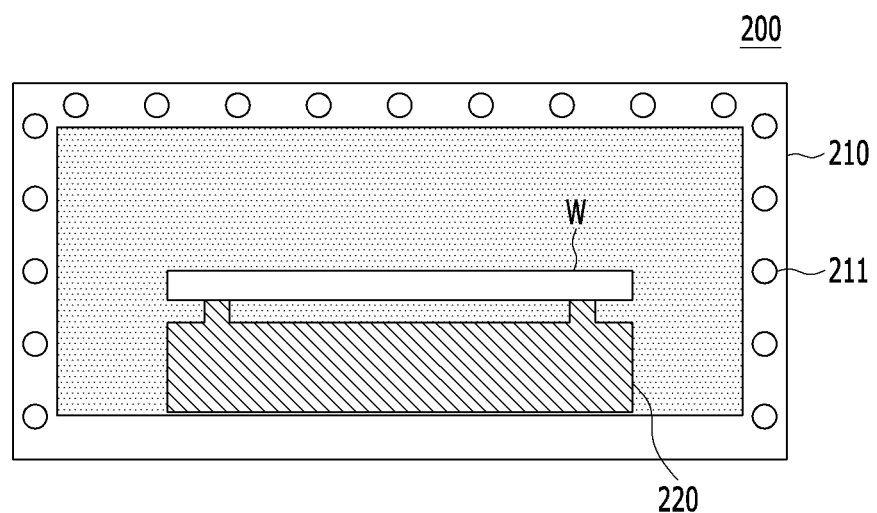
【FIG 3C】
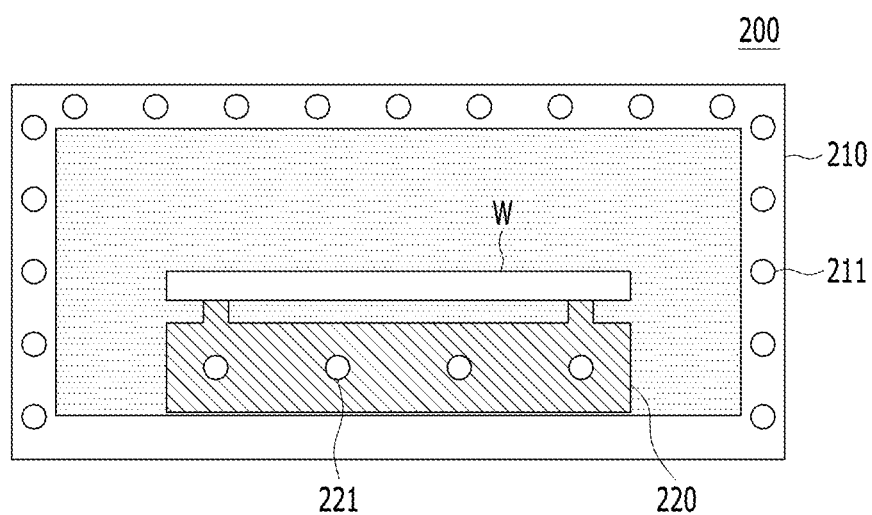

SUBSTRATE PROCESSING APPARATUS

This application claims the benefit under 35 U.S.C. § 119(a) of Korean Patent Application No. 10-2019-0134418 filed on Oct. 28, 2019, in the Korean Intellectual Property Office, the entire disclosure of which is incorporated herein by reference for all purposes.

TECHNICAL FIELD

The present invention relates to a substrate processing apparatus for processing a substrate, and more particularly, to a substrate processing apparatus capable of shortening a process time.

BACKGROUND ART

A process chamber of a general plasma processing apparatus supplies DC power to a DC electrode embedded in an electrostatic chuck (ESC) to electrostatically adsorb a substrate to the electrostatic chuck and supplies heater power to a heater embedded in the ESC to heat the substrate to a temperature suitable for the process. In addition, the process chamber forms plasma in a reaction space of the chamber by supplying high-frequency bias power to the ESC to form a desired thin film on the substrate or remove and pattern the thin film formed on the substrate.

In the process, much time is required to heat the substrate to a predetermined temperature by using the heater embedded in the ESC. Recently, improvement of the substrate processing apparatus is conducted to shorten a semiconductor manufacturing process time and increase production, and thus, it is required to improve the reduction in the process time.

DISCLOSURE

Technical Problem

In order to solve the problem described above, an object of the present invention is to provide a substrate processing apparatus capable of shortening a process time.

Technical Solution

According to an embodiment of the present invention, a substrate processing apparatus comprises an index chamber having a transfer robot loading/unloading a substrate; a process chamber having a heating means heating the substrate and processing the substrate; a loadlock chamber disposed between the index chamber and the process chamber; and a conveying chamber having a conveying robot conveying the substrate between the process chamber and the loadlock chamber, wherein a pre-heating means is provided in the conveying robot to pre-heat the substrate in a state before processing.

In the embodiment, the conveying robot may comprise a hand supporting the substrate and provided with a heater therein; and a robot body driving the hand, wherein the hand pre-heats the substrate in the state before processing by a contact heating method using the heater.

In the embodiment, the heater may be turned on when the substrate is mounted on the hand.

In the embodiment, the heater may be turned off when the substrate is not mounted on the hand.

In the embodiment, the conveying robot may comprise a hand supporting the substrate and having a heating lamp member irradiating light to the substrate; and a robot body driving the hand, wherein the hand pre-heats the substrate in the state before processing by a non-contact heating method using the heating lamp member.

In the embodiment, the heating lamp member may be turned on when the substrate is mounted on the hand.

In the embodiment, the heating lamp member may be turned off when the substrate is not mounted on the hand.

In the embodiment, the conveying robot may comprise a hand supporting the substrate, having a heater therein, and having a heating lamp member thereon; and a robot body driving the hand, wherein when the substrate in the state before processing is mounted, the hand turns on the heating lamp member and then turns on the heater to pre-heat the substrate in the state before processing sequentially.

According to another embodiment of the present invention, a substrate processing apparatus comprises an index chamber having a transfer robot loading/unloading a substrate; a process chamber having a heating means heating the substrate and processing the substrate; a loadlock chamber disposed between the index chamber and the process chamber; and a conveying chamber having a conveying robot conveying the substrate between the process chamber and the loadlock chamber, wherein a pre-heating means is provided in the loadlock chamber to pre-heat the substrate in a state before processing.

In the embodiment, the loadlock chamber may comprise a housing isolated from the outside; and a support unit provided in the housing and supporting the substrate, wherein a support unit heater is provided inside the support unit to pre-heat the substrate in the state before processing by a contact heating method.

In the embodiment, the support unit heater may be turned on when the substrate is mounted on the support unit.

In the embodiment, the support unit heater may be turned off when the substrate is not mounted on the support unit.

In the embodiment, the loadlock chamber may comprise a housing isolated from the outside; and a support unit provided in the housing and supporting the substrate, wherein a housing heater is provided in at least one of the insides of a side wall and an upper wall of the housing to pre-heat the substrate in the state before processing by a non-contact heating method.

In the embodiment, the support unit heater may be turned on when the substrate is mounted on the support unit.

In the embodiment, the support unit heater may be turned off when the substrate is not mounted on the support unit.

In the embodiment, the loadlock chamber may comprise a housing isolated from the outside; and a support unit provided in the housing and supporting the substrate, wherein a housing heater is provided in at least one of the insides of a side wall and an upper wall of the housing to pre-heat the substrate in the state before processing by a non-contact heating method, a support unit heater is provided in the support unit to pre-heat the substrate in the state before processing in a contact heating method, and when the substrate in the state before processing is mounted, the loadlock chamber turns on the housing heater and then turns on the support unit heater to pre-heat the substrate in the state before processing sequentially.

According to yet another embodiment of the present invention, a substrate processing apparatus comprises an index chamber having a transfer robot loading/unloading a substrate; a process chamber having a heating means heating the substrate and processing the substrate; a loadlock chamber disposed between the index chamber and the process chamber; and a conveying chamber having a conveying robot conveying the substrate between the process chamber and the loadlock chamber, wherein a pre-heating means is provided in each of the loadlock chamber and the conveying robot to pre-heat the substrate in a state before processing.

In the embodiment, the loadlock chamber comprises a housing forming an internal space in a vacuum state; and a support unit provided in the housing and supporting the substrate, a housing heater is provided in at least one of the insides of a side wall and an upper wall of the housing to pre-heat the substrate in the state before processing by a non-contact heating method, and a support unit heater is provided inside the support unit to pre-heat the substrate in the state before processing by a contact heating method.

In the embodiment, the conveying robot may comprise a hand comprising a contact heating type heater provided therein to generate heat and a non-contact heating type heating lamp provided thereon and supporting the substrate; and a robot body driving the hand.

In the embodiment, the heater may be turned on when the substrate is mounted on the hand and turned off when the substrate is not mounted on the hand.

Advantageous Effects

According to the present invention, a contact heating means or a non-contact heating means provided in at least one of a loadlock chamber and a conveying robot pre-heats the substrate in a state before processing, thereby shortening a time required for heating the substrate to a target temperature by the process chamber.

DESCRIPTION OF DRAWINGS

FIG. 1 is a plan view for describing a substrate processing apparatus according to an embodiment of the present invention.

FIGS. 2A to 2C are perspective views for describing various examples of a pre-heating means provided in a conveying robot illustrated in FIG. 1.

FIGS. 3A to 3C are cross-sectional views for describing various examples of a pre-heating means provided in a loadlock chamber illustrated in FIG. 1.

MODES OF THE INVENTION

Embodiments of the present invention may be modified in various forms and should not be construed that the scope of the present invention is limited to embodiments to be described below. The embodiments will be provided for more completely explaining the present invention to those skilled in the art. Therefore, shapes, and the like of components in the drawings are exaggerated to emphasize a more clear description.

In an embodiment of the present invention, a substrate processing apparatus for etching a substrate using plasma will be described. However, the present invention is not limited thereto, and is applicable to various kinds of devices.

FIG. 1 is a plan view for describing a substrate processing apparatus according to an embodiment of the present invention.

Referring to FIG. 1, a substrate processing apparatus 10 includes an index chamber 100, a loadlock chamber 200, a conveying chamber 300, and a process chamber 400.

The index chamber 100 includes a load port 110 and a transfer chamber 120.

A plurality of load ports 110 may be provided. A substrate receiving container such as a front opening unified pod (FOUP) for receiving a plurality of substrates is mounted on the load port 111. The substrate receiving container is loaded to the load port 110 or unloaded from the load port 110 by an automated conveying device such as an overhead hoist transfer (OHT) or an operator.

The transfer chamber 120 includes a transfer chamber housing 121 and a transfer robot 122.

The transfer chamber housing 121 provides an internal space isolated from the outside. The transfer robot 122 loads/unloads the substrate to/from the substrate receiving container mounted on the load port 110.

The loadlock chamber 200 is disposed between the index chamber 100 and the conveying chamber 300. The loadlock chamber 200 provides a buffer space in which the substrate is exchanged between the index chamber 100 and the conveying chamber 300. In the buffer space, the substrate may temporarily stay. A plurality of loadlock chambers 200 may be provided. The loadlock chamber 200 includes a loadlock chamber housing 210 isolated from the outside, and a support unit 220 supporting the substrate.

The loadlock chamber 200 may include a pre-heating means for pre-heating the substrate in a state before processing. The pre-heating means will be described below in detail.

The conveying chamber 300 conveys the substrate between the loadlock chamber 200 and the process chamber 400. The conveying chamber 300 may be provided in the form of a polygon. The conveying chamber 300 includes a conveying chamber housing 310 isolated from the outside and a conveying robot 320 for conveying the substrate.

The conveying robot 320 conveys the substrate between the process chamber 400 and the loadlock chamber 200. The conveying robot 320 includes a hand 321 supporting the substrate and a robot body 322 driving the hand 321. The conveying robot 320 may include a pre-heating means for pre-heating the substrate in a state before processing. The pre-heating means will be described below in detail.

The process chamber 400 is provided at a circumference of the conveying chamber 300. The process chamber 400 receives the substrate from the conveying robot 320 of the conveying chamber 300 when an opening (not illustrated) is opened.

The process chamber 400 is provided with a heating means for heating the substrate to process the substrate. The processing process may be an etching process. The process chamber 400 includes a chamber housing (not illustrated), a support member 410, a gas supply member (not illustrated), and a plasma generating unit (not illustrated). The support member 410 includes an electrostatic chuck (ESC). The ESC includes an electrostatic chuck heater therein as a heating means for heating the substrate. The electrostatic chuck heater heats the substrate to a target temperature suitable for performing the process.

On the other hand, a time required for raising the temperature of the substrate to a target temperature by heating the substrate occupies a large part of the total process time. Accordingly, in the present invention, the substrate in the state before processing is pre-heated by using the pre-heating means provided in at least one of the conveying robot 320 and the loadlock chamber 200. Therefore, the time required to raise the temperature of the substrate to the target temperature in the process chamber is reduced, thereby shortening the total process time.

The processing process may be various substrate processing processes, not an etching process. As an example, the processing process may be a separation process, an ashing process, a stripping process or a deposition process. One or a plurality of process chamber(s) 400 may be provided.

If the plurality of process chambers 400 is provided, some or all of the process chambers 400 may perform the same process as or different processes from each other. The internal pressure of the process chamber 400 is maintained at a predetermined pressure to provide a suitable environment to perform a processing process. For example, the internal pressure may be maintained at a lower pressure than atmospheric pressure or in a vacuum state. After the processing process is completed, the substrate is conveyed out of the processing chamber 400 by the conveying robot 320.

Hereinafter, the pre-heating means provided in at least one of the conveying robot 320 and the loadlock chamber 200 will be described in detail.

FIGS. 2A to 2C are perspective views for describing various examples of the pre-heating means provided in the conveying robot illustrated in FIG. 1.

The conveying robot 320 includes a hand 321 supporting the substrate and a robot body 322 for driving the hand 321 to convey the substrate. The hand 321 of the conveying robot 320 may be provided with a contact-type or non-contact type of pre-heating means for pre-heating the substrate in the state before processing.

Referring to FIG. 2A, a heater 323 may be provided inside the hand 321 as a heating means for pre-heating the substrate in the state before processing by a contact heating method. At this time, in order to extend a contact area with the substrate, the shapes of the hand 321 and the heater 323 may also be provided so as to correspond to the shape of the substrate.

When the substrate in the state before processing is mounted on the hand 321, the heater 323 is turned on and heated. The substrate mounted on the hand 321 is heated by the heating heater 323.

On the other hand, when the substrate mounted on the hand 321 is a substrate in which the processing is completed or when the substrate is not mounted on the hand 321, the heater 323 may be turned off for reducing consumption power. Alternatively, unlike this, the heater 323 may also be always maintained in a turn-on state.

As described above, when the heater 323 is provided inside the hand 321, there is an advantage capable of quickly heating the substrate by a contact heating method.

Referring to FIG. 2B, a heating lamp member 324 may be provided on the hand 321. The heating ramp member 324 irradiates light to the substrate to pre-heat the substrate by a non-contact heating method.

When the substrate in the state before processing is mounted on the hand 321, the heating ramp member 324 is turned on. The turned-on heating ramp member 324 irradiates light to the substrate to heat the substrate.

The non-contact heating method using the heating ramp member 324 has a lower heating rate than the contact heating method using the heater 323, but has an advantage capable of preventing damages to the substrate.

On the other hand, when the substrate mounted on the hand 321 is a substrate in which the processing is completed or when the substrate is not supported on the hand 321, the heating ramp member 324 may be turned off for reducing consumption power. Alternatively, unlike this, the heating ramp member 324 may be maintained in the turn-on state even during the substrate processing process.

Referring to FIG. 2C, both the heater 323 of FIG. 2A and the heating lamp member 324 of FIG. 2B may be provided on the hand 321. In this case, the non-contact heating type heating lamp member 324 and the contact heating type heater 323 may be simultaneously turned on or sequentially turned on.

When the heating lamp member 324 and the heater 323 are sequentially turned on, it is preferable that the non-contact heating type heating lamp member 324 is first turned on and then the contact heating type heater 323 is turned on. That is, when the substrate in the state before processing is mounted, the hand 321 first turns on the heating lamp member 324 and then turns on the heater 323 to sequentially pre-heat the substrate in the state before processing. When the heating lamp member 324 is first turned on, the temperature of the substrate is gradually increased, thereby reducing the risk of damage to the substrate due to thermal stress. In addition, the heater 323 is turned on after a predetermined period of time has elapsed from the time when the heating lamp member 324 is turned on. The heating rate of the substrate is improved by the turned-on heater 323 and heating lamp member 324.

According to the present invention, since the substrate in the state before processing is pre-heated by the contact type or non-contact type pre-heating means provided in the hand of the conveying robot, the process time in the process chamber is shortened and the production is increased.

FIGS. 3A to 3C are cross-sectional views illustrating various examples of the pre-heating means provided in the loadlock chamber illustrated in FIG. 1.

The loadlock chamber 200 includes a loadlock chamber housing 210 isolated from the outside and a support unit 220 supporting the substrate. The loadlock chamber 200 may be provided with a contact type or non-contact type pre-heating means.

Referring to FIG. 3A, a support unit heater 221 may be provided inside the support unit 220 as a heating means for pre-heating the substrate in the state before processing by a contact heating method. For example, the support unit 220 may be a heating chuck including the support unit heater 221.

When the substrate in the state before processing is mounted on the support unit 220, the support unit heater 221 is turned on to generate heat, so that the substrate mounted on the support unit 220 is contacted and heated.

On the other hand, when the substrate mounted on the support unit 220 is a substrate in which the processing is completed or when the substrate is not mounted on the support unit 220, the support unit heater 221 may be turned off to reduce power consumption. Alternatively, unlike this, the support unit heater 221 may always be maintained in a turned-on state.

As described above, when the support unit heater 221 is provided inside the support unit 220, there is an advantage of quickly heating the substrate by the contact heating method.

Referring to FIG. 3B, a housing heater 211 may be provided in at least one of the insides of a side wall and an upper wall of the loadlock chamber housing 210 as a heating means for pre-heating the substrate in the state before processing by a non-contact heating method.

When the substrate in the state before processing is mounted on the support unit 220, the housing heater 211 is turned on. The inside of the loadlock chamber 200 is heated by the turned-on housing heater 211, and the substrate located inside the heated loadlock chamber 200 is also heated. The non-contact heating method using the housing heater 211 has a lower heating rate than the contact heating method using the support unit heater 221, but has an advantage of preventing damage to the substrate.

On the other hand, when the substrate mounted on the support unit 220 is a substrate in which the processing is completed or when the substrate is not mounted on the support unit 220, the housing heater 211 may be turned off to reduce power consumption. Alternatively, unlike this, the housing heater 211 may always be maintained in a turn-on state.

Referring to FIG. 3C, both the support unit heater 221 of FIG. 3A and the housing heater 211 of FIG. 3B may be provided in the loadlock chamber 200. In this case, the non-contact heating type housing member 211 and the contact heating type support unit heater 221 may be simultaneously turned on or sequentially turned on.

When the housing heater 211 and the support unit heater 221 are sequentially turned on, it is preferable that the non-contact heating type housing member 211 is first turned on and then the contact heating type support unit heater 221 is turned on.

When the substrate in the state before processing is mounted, the loadlock chamber first turns on the housing heater 211 and then turns on the support unit heater 221 to sequentially pre-heat the substrate in the state before processing. Accordingly, since the housing heater 211 is first turned on, the temperature of the substrate is gradually increased to reduce the risk of damage to the substrate due to thermal stress. In addition, the support unit heater 221 is turned on after a predetermined period of time from the time when the housing heater 211 is turned on, so that the heating rate of the substrate is improved by the support unit heater 221 and the housing heater 211.

According to the present invention, since the substrate in the state before processing is pre-heated by the contact type or non-contact type pre-heating means provided in the loadlock chamber, the process time in the process chamber is shortened and the production is increased.

As illustrated in FIGS. 2A to 3C, the pre-heating means may also be provided only in the loadlock chamber 200 or may be provided only in the conveying robot 320. Alternatively, unlike this, the pre-heating means may be provided in both the loadlock chamber 200 and the conveying robot 320. In particular, as illustrated in FIGS. 2C and 3C, both the loadlock chamber 200 and the conveying robot 320 of the present invention may be provided with a pre-heating means for pre-heating the substrate in the state before processing, respectively. When both the contact type pre-heating means and the non-contact type pre-heating means are provided in each of the loadlock chamber 200 and the conveying robot 320, the pre-heating degree of the substrate may be improved as compared with the case where the pre-heating means is provided in any one of the loadlock chamber 200 and the conveying robot 320.

The previous contents relate to a preferred embodiment of the present invention, but other and additional embodiments of the present invention can be derived without departing from its basic scope. The scope of the present invention will be determined by the following claims.

[Explanation of Reference Numerals and Symbols]

| | |
|---|---|
| 100: Index chamber | 110: Load port |
| 120: Transfer chamber | 121: Transfer chamber housing |
| 122: Transfer robot | 200: Loadlock chamber |
| 210: Loadlock housing | 211: Housing heater |
| 220: Support unit | 221: Support unit heater |
| 300: Conveying chamber | 310: Conveying chamber housing |

[Explanation of Reference Numerals and Symbols]

| | |
|---|---|
| 320: Conveying robot | 321: Hand |
| 322: Robot body | 323: Heater |
| 324: Heating lamp member | 400: Process chamber |

The invention claimed is:

1. A substrate processing apparatus, comprising:
an index chamber comprising a transfer robot configured to load/unload a substrate;
a process chamber comprising a heater configured to heat the substrate and processing the substrate;
a loadlock chamber disposed between the index chamber and the process chamber; and
a conveying chamber comprising a conveying robot configured to convey the substrate between the process chamber and the loadlock chamber,
wherein the loadlock chamber comprises one or more preheaters configured to preheat the substrate, and
wherein the conveying robot comprises:
a hand configured to support the substrate and equipped with a heating lamp and a hand preheater configured to preheat the substrate mounted on the hand when the substrate is conveyed from the loadlock chamber to the process chamber in a pre-processing state.

2. The substrate processing apparatus of claim 1, wherein the conveying robot comprises:
a robot body configured to drive the hand,
wherein the hand preheater is provided inside the hand, and
wherein the heating lamp and the hand preheater are configured to preheat the substrate in a non-contact and contact manner, respectively.

3. The substrate processing apparatus of claim 2, wherein the one or more preheaters of the loadlock chamber are configured to turn on when the substrate is mounted on a supporting unit of the loadlock chamber.

4. The substrate processing apparatus of claim 3, wherein the one or more preheaters of the loadlock chamber are configured to turn off when the substrate is not mounted on the supporting unit of the loadlock chamber.

5. The substrate processing apparatus of claim 1, wherein the conveying robot comprises:
a robot body configured to drive the hand, and
wherein the heating lamp is configured to preheat the substrate in a non-contact manner in the pre-processing state.

6. The substrate processing apparatus of claim 1, wherein the heating lamp is configured to turn on before the hand preheater turns on when the substrate is mounted on the hand.

7. The substrate processing apparatus of claim 1, wherein the heating lamp is configured to turn off when the substrate is not mounted on the hand.

8. The substrate processing apparatus of claim 1,
wherein the conveying robot comprises:
a robot body configured to drive the hand, and
wherein when the substrate is mounted on the hand in the pre-processing state, the heating lamp and the hand preheater are sequentially turned on to preheat the substrate in the pre-processing state.

9. A substrate processing apparatus comprising:
an index chamber comprising a transfer robot configured to load/unload a substrate;
a process chamber comprising a heater configured to heat the substrate and processing the substrate;

a loadlock chamber disposed between the index chamber and the process chamber; and a conveying chamber comprising a conveying robot configured to convey the substrate between the process chamber and the loadlock chamber, wherein the loadlock chamber comprises a housing preheater and a support unit preheater respectively configured to preheat the substrate, and wherein the conveying robot comprises:

a hand configured to support the substrate and equipped with a heating lamp and a hand preheater configured to preheat the substrate mounted on the hand when the substrate is conveyed from the loadlock chamber to the process chamber in a pre-processing state.

10. The substrate processing apparatus of claim 9, wherein the loadlock chamber comprises:

a housing isolated from the outside; and a support unit provided in the housing and configured to support the substrate, wherein the support unit preheater is provided inside the support unit to preheat the substrate in a contact manner, wherein the housing preheater is configured to preheat the substrate in a non-contact manner, wherein the hand preheater of the conveying chamber is configured to preheat the substrate in a contact manner, and wherein the housing preheater is configured to turn on before the support unit preheater turns on when the substrate is mounted on the support unit of the loadlock chamber.

11. The substrate processing apparatus of claim 10, wherein the support unit preheater is configured to turn on when the substrate is mounted on the support unit.

12. The substrate processing apparatus of claim 10, wherein the support unit preheater is configured to turn off when the substrate is not mounted on the support unit.

13. The substrate processing apparatus of claim 9, wherein the loadlock chamber comprises:

a housing isolated from the outside; and a support unit provided in the housing and configured to support the substrate, wherein the housing preheater is provided in an interior of at least one of a side wall and a top wall of the housing.

14. The substrate processing apparatus of claim 13, wherein the housing preheater is configured to turn on to preheat the substrate in a non-contact manner when the substrate is mounted on the support unit.

15. The substrate processing apparatus of claim 13, wherein the housing preheater is configured to turn off when the substrate is not mounted on the support unit.

16. The substrate processing apparatus of claim 9, wherein the loadlock chamber comprises:

a housing isolated from the outside; and a support unit provided in the housing and configured to support the substrate, wherein the housing preheater is provided in an interior of at least one of a side wall and a top wall of the housing, wherein the support unit preheater is provided in the support unit to preheat the substrate in a contact manner, and wherein when the substrate is mounted on the support unit, the loadlock chamber is configured to turn on the housing preheater and then the support unit preheater to sequentially preheat the substrate.

17. A substrate processing apparatus comprising:

an index chamber comprising a transfer robot configured to load/unload a substrate;

a process chamber comprising a heater configured to heat the substrate and processing the substrate;

a loadlock chamber disposed between the index chamber and the process chamber; and a conveying chamber comprising a conveying robot configured to convey the substrate between the process chamber and the loadlock chamber, wherein a housing preheater and a support unit preheater are provided in the loadlock chamber, wherein the conveying robot comprises:

a hand configured to support the substrate and equipped with a heating lamp and a hand preheater configured to preheat the substrate mounted on the hand when the substrate is conveyed from the loadlock chamber to the process chamber in a pre-processing state, and wherein the housing preheater is configured to turn on before the support unit preheater turns on to sequentially preheat the substrate when the substrate is mounted on the support unit.

18. The substrate processing apparatus of claim 17, wherein the loadlock chamber comprises:

a housing forming an internal space in a vacuum state; and a support unit provided in the housing and configured to support the substrate, wherein the housing preheater is provided in an interior of at least one of a side wall and a top wall of the housing to preheat the substrate in a non-contact manner, and wherein the support unit heater is provided inside the support unit to preheat the substrate in a contact manner.

19. The substrate processing apparatus of claim 17, wherein the conveying robot comprises:

a robot body configured to drive the hand, wherein the heating lamp is configured to turn on before the hand preheater turns on to sequentially preheat the substrate when the substrate is mounted on the hand of the conveying robot.

20. The substrate processing apparatus of claim 19, wherein the hand preheater is configured to turn on when the substrate is mounted on the hand and turn off when the substrate is not mounted on the hand.

* * * * *